United States Patent
Palazzola et al.

(10) Patent No.: US 9,652,966 B2
(45) Date of Patent: May 16, 2017

(54) JUMPERS AND METHODS OF MAKING AND USING SAME

(71) Applicants: ThyssenKrupp Elevator AG, Essen (DE); ThyssenKrupp AG, Essen (DE)

(72) Inventors: Mike Palazzola, Horn Lake, MS (US); Jimmy Xu, Cordova, TN (US); Keith Anderson, Jackson, TN (US); Peter F. Feldhusen, Collierville, TN (US); Alan M. Parker, Byhalia, MS (US); Frank P. Dudde, Collierville, TN (US); Olivia Stone, Memphis, TN (US); William K. Delk, Olive Branch, MS (US)

(73) Assignees: ThyssenKrupp Elevator AG, Essen (DE); ThyssenKrupp AG, Essen (DE)

( * ) Notice: Subject to any disclaimer, the term of this patent is extended or adjusted under 35 U.S.C. 154(b) by 79 days.

(21) Appl. No.: 14/643,302

(22) Filed: Mar. 10, 2015

(65) Prior Publication Data

US 2016/0267767 A1   Sep. 15, 2016

(51) Int. Cl.
| | | |
|---|---|---|
| *B66B 5/00* | (2006.01) | |
| *G08B 21/18* | (2006.01) | |
| *G08C 17/02* | (2006.01) | |
| *G08B 5/36* | (2006.01) | |
| *G08B 6/00* | (2006.01) | |
| *G01R 31/317* | (2006.01) | |
| *G01R 31/02* | (2006.01) | |
| *G01R 31/01* | (2006.01) | |
| *B66B 5/02* | (2006.01) | |

(52) U.S. Cl.
CPC ............... *G08B 21/18* (2013.01); *B66B 5/00* (2013.01); *G08B 5/36* (2013.01); *G08B 6/00* (2013.01); *G08C 17/02* (2013.01); *B66B 5/005* (2013.01); *B66B 5/0018* (2013.01); *B66B 5/02* (2013.01); *G01R 31/013* (2013.01); *G01R 31/02* (2013.01); *G01R 31/31728* (2013.01); *G08C 2201/93* (2013.01)

(58) Field of Classification Search
CPC ........................................ B66B 5/0093
See application file for complete search history.

(56) References Cited

U.S. PATENT DOCUMENTS

| | | | |
|---|---|---|---|
| 7,648,387 B2 | 1/2010 | Wurth | |
| 2009/0121731 A1* | 5/2009 | Wurth | G01R 31/026 324/750.01 |
| 2014/0117777 A1 | 5/2014 | Rees | |
| 2016/0148496 A1* | 5/2016 | Meredith | G08B 27/00 340/286.07 |

* cited by examiner

*Primary Examiner* — Steven Lim
*Assistant Examiner* — Benyam Haile
(74) *Attorney, Agent, or Firm* — Lathrop & Gage L.L.P.

(57) ABSTRACT

A jumper has a connector and a housing. The housing at least partially encloses a processor in data communication with a non-transitory memory, a global positioning system, a rechargeable battery, and a networking device. The memory comprises software instructions that, when executed by the processor, perform steps for wirelessly transmitting data to a mobile device over a network. The data indicates a jumper identification number, a location of the jumper, and a duration after which the jumper will automatically deactivate. The steps performed include the step of wirelessly outputting an alert to the mobile device when the mobile device is at a first distance from the jumper. The first distance is settable using the mobile device. The alert causes the mobile device to at least one of vibrate and ring.

20 Claims, 8 Drawing Sheets

ACTIVATION/DEACTIVATION SETUP 160

|  | ENABLE | DISABLE |
|---|---|---|
| Bluetooth Option 160A | ● | ○ |
| WiFi Option 160B | ● | ○ |
| Timer Option 160C | ● | ○ |
|     Timer 161C [30 min. ▼] | | |
| Manal Option 160D | ○ | ● |
| GPS/Distance Option 160E | ● | ○ |
|     Distance 161E [100 feet ▼] | | |

154C →

WARNINGS SETUP 162

| | ENABLE | DISABLE |
|---|---|---|
| Vibrate Option 162A | ● | ○ |
| Ringer Option 162B | ● | ○ |
| Indicator 112 Option 162C | ● | ○ |

INDICATOR SETUP 164

| | |
|---|---|
| Normal Operation Indication 164A | [Green ▼] |
| Out of Range Indication 164B | [Red ▼] |
| Low Battery Indication 164C | [Yellow ▼] |
| Timer Elapsing Indication 164D | [Blink ▼] |

TERMINALS SETUP 165

Terminals 170, 172 jumped: [TL1 ▼] [TK5 ▼]

Reason for using jumper 100: malfunction in subsystem 50C

FIG. 8D

JUMPERS AND METHODS OF MAKING AND USING SAME

FIELD OF THE INVENTION

The invention relates generally to the field of jumpers. More specifically, the invention relates to jumpers that may be controlled using mobile computing devices at locations remote from the jumpers.

SUMMARY

Systems and methods for making and using jumpers are disclosed herein. According to an embodiment, a system comprises a mobile device, a server, and a jumper in bidirectional wireless communication with the mobile device. The jumper comprises a first processor in data communication with a first memory. The mobile device comprises a second processor in data communication with a second memory. The first memory includes a first set of software instructions and the second memory includes a second set of software instructions. The first set of software instructions and the second set of software instructions, when executed respectively by the first processor and the second processor, collectively perform steps for wirelessly transmitting a command from the mobile device to the jumper. The command causes the jumper to activate or deactivate. The steps include the step of outputting on the mobile device an alert when the mobile device is at a first distance from the jumper. The first distance is settable using the mobile device. The alert causes the mobile device to vibrate or ring. The steps also include the step of transmitting a log of the jumper to the server. The log identifies at least the alert, a location of the jumper, and a terminal to which a jumper connector is coupled.

According to another embodiment, a jumper has a connector and a housing. The housing at least partially encloses a processor in data communication with a non-transitory memory, a global positioning system, a rechargeable battery, and a networking device. The memory comprises software instructions that, when executed by the processor, perform steps for wirelessly transmitting data to a mobile device over a network. The data indicates a jumper identification number, a location of the jumper, and a duration after which the jumper will automatically deactivate. The steps performed include the step of wirelessly outputting an alert to the mobile device when the mobile device is at a first distance from the jumper. The first distance is settable using the mobile device. The alert causes the mobile device to at least one of vibrate and ring.

According to yet another embodiment, a system comprising a jumper, a mobile device, and a server is disclosed. The jumper is in bidirectional wireless communication with the mobile device. The jumper comprises a first processor in data communication with a first memory, and the mobile device comprises a second processor in data communication with a second memory. The first memory includes a first set of software instructions, and the second memory includes a second set of software instructions. The first set of software instructions and the second set of software instructions, when executed respectively by the first processor and the second processor, collectively perform steps for wirelessly transmitting from the mobile device to the jumper a command which causes the jumper to activate or deactivate. The steps include the step of outputting on the mobile device an alert when the mobile device is at a first distance from the jumper, and of transmitting a log of the jumper to the server.

BRIEF DESCRIPTION OF THE SEVERAL VIEWS OF THE DRAWINGS

Illustrative embodiments of the present invention are described in detail below with reference to the attached drawing figures and wherein.

DETAILED DESCRIPTION

A control system is a system that manages, commands, directs, or regulates the behavior of other devices or systems. Such systems are ubiquitous. For example, an elevator control system may control the operation of various elevators in an elevator bank. An assembly line control system may for instance manage the operation of an assembly line in an automotive manufacturing plant. Typically, these control systems have a plurality of individual control circuits. Each individual circuit, in-turn, has a plurality of discrete elements, such as one or more microprocessors, resistors, capacitors, diodes, conductors, solenoids, relays, power sources, et cetera. Malfunctioning of any discrete element within the circuit may adversely affect the operation of the entire control system. When such a system malfunctions, a service technician (or other personnel) may attempt to diagnose and fix the problem.

At some point during the course of the repair, the service technician may utilize a jumper. Jumpers, versions of which are known in the art, allow the technician to temporarily connect a circuit or circuit element to another, to isolate a circuit element from other elements in the circuit, and to bypass one or more parts of the circuit, so that the cause of the malfunction may be narrowed down and more efficiently rectified. Jumpers may also be used to open, close, and bypass circuits or circuit elements so that routine maintenance may be performed.

Figure 1:
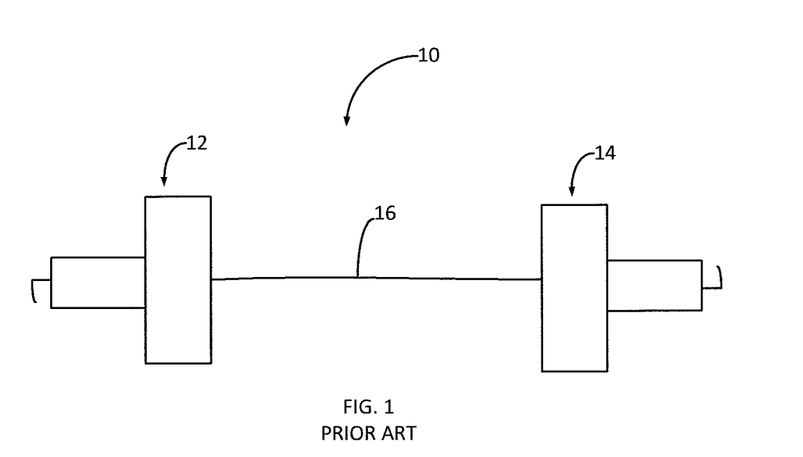
FIG. 1 is a top view of a PRIOR ART jumper.

FIG. 1 shows a prior art jumper 10. The jumper 10 has a first connector 12, a second connector 14, and a conducting wire 16 connecting the first connector 12 and the second connector 14. While the first connector 12 and the second connector 14 are shown in FIG. 1 as spring-loaded mini-clips, other types of connectors may also be employed. The properties of the conducting wire 16 (e.g., length, gauge, et cetera) may be selected to suit the requirements of the particular application (e.g., repair or maintenance of an elevator control system).

Figure 2:
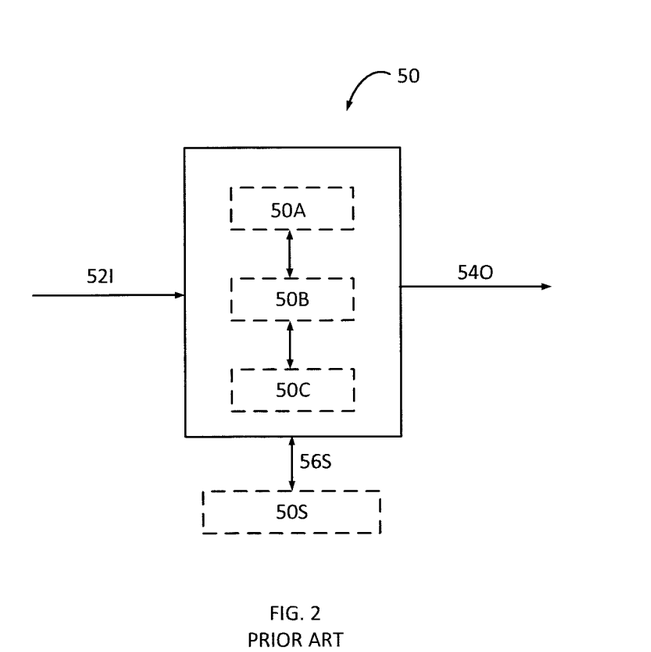
FIG. 2 is a schematic illustrating a PRIOR ART elevator control system.

Focus is directed now to FIG. 2, which shows a prior art elevator control system 50 for controlling the operation of elevators in an elevator bank. The elevator control system 50 may have various subsystems, such as subsystems 50A, 50B, and 50C, and multiple inputs 52I and outputs 54O. The inputs 52I may comprise, for instance, elevator call requests, information from sensors indicating the arrival of passengers into the elevators, information from sensors indicating the proximity of an elevator to a particular floor, et cetera, and the outputs 54O may include, for example, commands to the elevator doors, motors, and lamps. The subsystems 50A, 50B, 50C, may comprise hardware and/or software configured to monitor and control the operation of the elevators, as is known in the art.

All modern elevators have certain safety features 56S. These safety features 56S may include, for example, speed governors, final limit switches, buffers, manual override alarms, door sensors, interlocks, et cetera. The skilled artisans appreciate that the failure of one or more of these safety features may lead to catastrophic results (e.g., death or dismemberment of one or more passengers aboard, entering, or exiting the elevator). One or more of these safety features 56S may be controlled, monitored, and/or implemented by a safety subsystem 50S, which while illustrated in FIG. 2 as a separate subsystem in electronic communication with the control system 50, may be part of the control system 50.

When an elevator malfunctions, a service technician may be dispatched to diagnose and fix the problem. Prior to or during the repair work, the technician may be required to disable the safety features 56S. The service technician may use a jumper, such as the jumper 10, to bridge (i.e., disable) one or more of the safety features 56S. After the service or maintenance work is complete, the service technician may remove the jumper 10 from the terminals to ensure that none of the safety features 56S are disabled during normal use of the elevators. The skilled artisans appreciate that the service technician may also need to bridge the safety features 56S when conducting routine maintenance.

Unfortunately, it is not uncommon for a service technician to inadvertently leave the jumper 10 connected to the terminals such that the safety features 56S remain disabled after the service technician has exited the site. Passengers, who are unaware that one or more safety features 56S are currently disabled because of the jumper 10, may continue to ride the elevators. This has led to disastrous results; numerous elevator accidents have occurred simply because a jumper (such as the jumper 10) bridging the safety features 56S was unintentionally left behind by a service technician.

Several mechanisms have been developed to curb such accidents and ensure that the jumpers are removed by the service technicians once the maintenance and/or repair work is complete. For example, some elevator service technicians are required by their respective employers (e.g., elevator manufacturers) to maintain a written logbook that outlines whether the service technician is currently in the possession of a diagnostic jumper. Such methods, while sometimes effective, have not entirely solved the problem. Paper logs are error prone and cannot automatically warn service technicians that a jumper has been inadvertently left behind. Further, the entry and compilation of information in the paper logs has proved to be inefficient and cumbersome.

Figure 3:
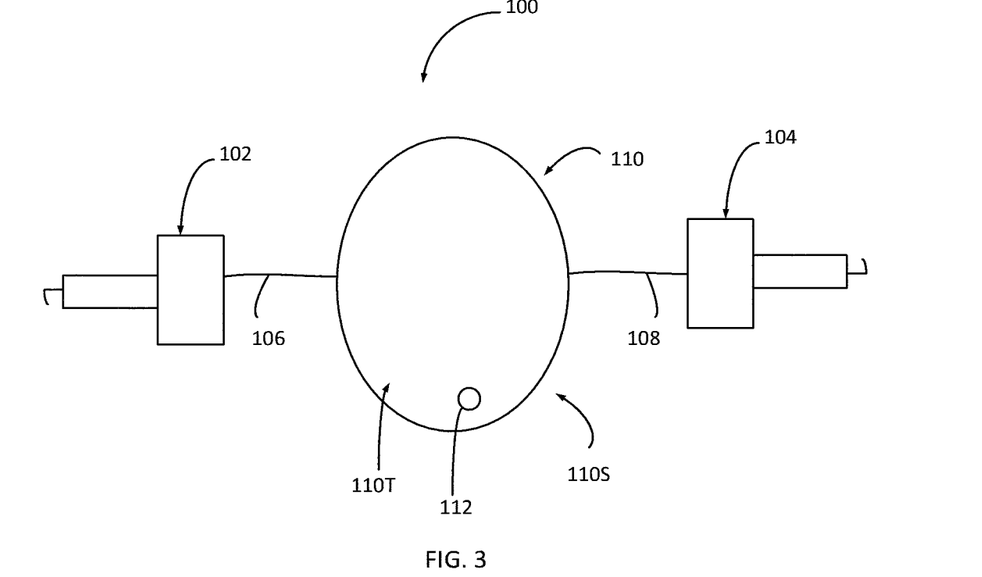
FIG. 3 is a top view of a jumper, according to an embodiment of the present invention.

Attention is directed now to FIG. 3, which shows a jumper 100 in line with some teachings of the present invention. The jumper 100 may be portable and have a first connector 102, a second connector 104, a first wire 106, a second wire 108, and a housing 110. The housing 110 may have an indicator 112.

The first connector 102 and the second connector 104 may each be spring loaded mini-clips as shown. In other embodiments, however, other types of connectors may be employed. The first and second connectors 102, 104 may in some embodiments be different from one another. Further, in some embodiments, the connectors 102, 104 may be configured to be changeable so that different types of connectors may be used as desired to suit the requirements of a particular application.

The housing 110 may be generally cylindrical or take on other regular or irregular shapes as desired. The housing 110 may have a top surface 110T, a side surface 110S, and a bottom surface opposite the top surface 110T, and the indicator 112 may be visible at the top surface 110T. The housing 110 may be configured to house various components, as discussed in more detail below.

Figure 4:
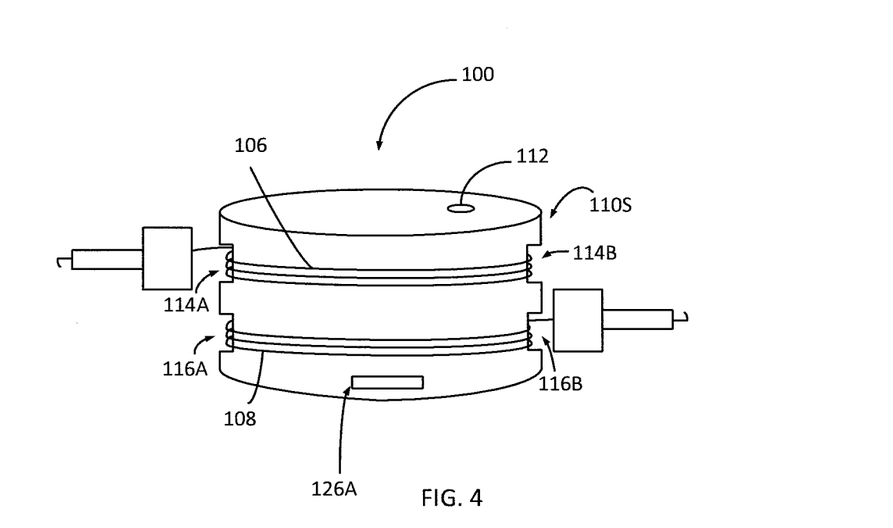
FIG. 4 is a perspective view of the jumper of FIG. 3, according to an embodiment.

The first wire 106 may extend from the housing side surface 110S to the first connector 102 and the second wire 108 may extend from the housing side surface 110S to the second connector 104. While not required, in some embodiments the housing side surface 110S may have recessed retaining portions 114A, 114B, 116A, and 116D (see FIG. 4). The retaining portions 114A, 114B may be configured to retain at least part of the first wire 106 and the retaining portions 116A, 116B may be configured to retain at least part of the second wire 108 when the jumper 100 is not in use. The retaining portions 114A, 114B, 116A, 116D may thus prevent the first wire 106 and the second wire 108 from becoming undesirably entangled. In some embodiments, the first wire 106 and the second wire 108 may be retractable (i.e., the housing 110 may include a winding mechanism (e.g., a spring) that pulls the first wire 106 and the second wire 108 within the housing 110 when the jumper 100 is not in use). It will be understood that the jumper 100 is not required to have such functionality.

Figure 5:
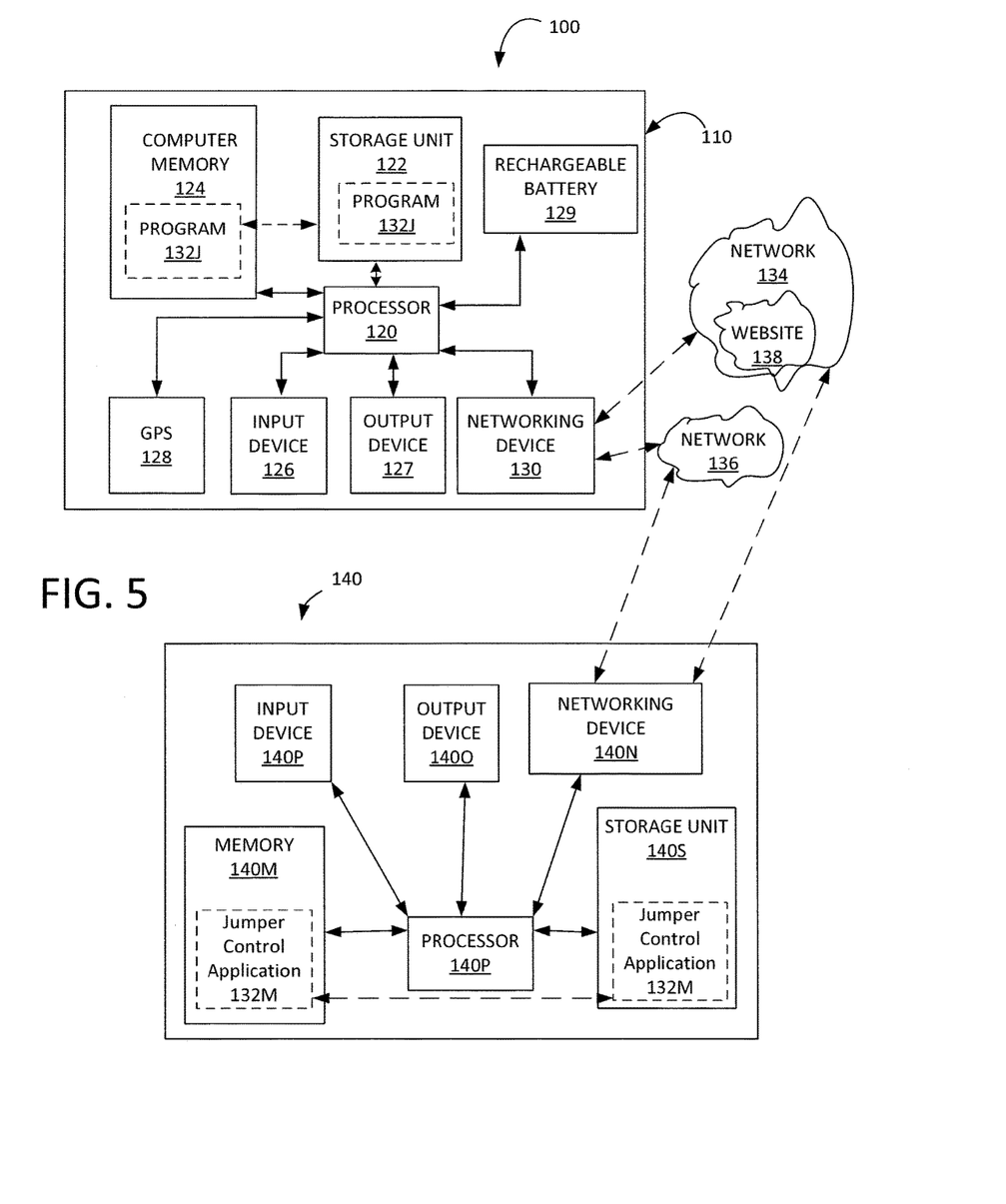
FIG. 5 is a schematic illustrating electronic communication between various components of the jumper of FIG. 3 and a mobile device, according to an embodiment.

Focus is directed now to FIG. 5, which shows schematically the contents of the housing 110 of the jumper 100. The housing 110 may at least partially enclose a processor 120, a storage unit 122, a computer memory 124, an input device 126, an output device 127, a global positioning system 128, a rechargeable battery 129, and a networking device 130. As can be seen, the processor 120 may be in electronic communication with the storage unit 122, the computer memory 124, the input device 126, the output device 127, the global positioning system 128, the rechargeable battery 129, and the networking device 130, each of which are discussed in further detail below. In some embodiments, some or all these components may be located on a solitary chip.

The storage unit 122 may be, for example, a disk drive that stores programs and data, and the storage unit 122 is illustratively shown storing a program 132J embodying the steps and methods set forth below. It should be understood that the program 132J could be broken into subprograms and stored in storage units of separate computers and that data could be transferred between those storage units using methods known in the art. A dashed outline within the computer memory 124 (e.g., RAM) represents the software program 132J loaded into the computer memory 124 and a dashed line between the storage unit 122 and the computer memory 124 illustrates the transfer of the program 132J between the storage unit 122 and the computer memory 124.

The input device 126 may be any input device that allows for or facilitates the transfer of data to the jumper 100. For example, the input device 126 may be a port (e.g., a USB port 126A, see FIG. 4), a slot (e.g., an SD card slot), a switch, a knob, a biometric sensor (e.g., iris sensor, voice recognition sensor, or fingerprint scanner), and/or any other appropriate input device whether currently available or later developed. The output device 127 may similarly be any suitable device that allows the jumper 100 (and more specifically, the processor 120) to output data, such as an LED or other light, a display screen (e.g., an LCD screen), an alarm, or any other appropriate visual and/or audible output device whether currently available or subsequently created. In one embodiment, the output device 127 may comprise the indicator 112 (see FIG. 4). The indicator 112 may for example be a light that can light up and/or change colors to convey varying information, as discussed in more detail below. In some embodiments, the input and output devices 126, 127 may be a solitary device (e.g., a settable timer with a countdown display).

The jumper 100 may in some embodiments include a satellite positioning function, illustrated in FIG. 5 as the GPS 128. The GPS 128 may communicate with satellites to identify a current location of the jumper 100. In some embodiments, the satellite positioning function may utilize other location determining techniques (e.g., cell tower triangulation). And in some embodiments, the GPS 128 may be omitted.

The power to the various components of the jumper 100 may be provided by the battery 129. The battery 129 may be any suitable type of battery, such as a Lithium-Polymer battery, a Lithium Ion battery, a Nickel Cadmium battery, a Lead Acid battery, et cetera. In some embodiments, the battery 129 may be configured to be rechargeable. For example, the jumper 100 may be connected to a power outlet (not shown) via the USB port 126A to recharge the battery 129. In some embodiments, the battery 129 may be easily replaceable (e.g., the housing 110 may include a chamber which may be conveniently opened to provide access to the battery 129 to allow the replacement thereof).

The networking device 130 may be any device that allows the jumper 100 to communicate over a network, such as networks 134 and 136. For example, the networking device 130 may be a transceiver, a transmitter, a router, a modem, a hub, a network interface card, a Bluetooth or RFID emitter and detector, et cetera. In some embodiments, the networking device 130 may allow the jumper 100 to communicate over the networks 134 and/or 136 wirelessly. The networks 134 and 136, similarly, may be any type of network whether now available or later developed (e.g., Bluetooth, the Word Wide Web or Internet, Intranet, GSM, CDMA, et cetera). In one embodiment, as discussed herein, the network 134 may be a wireless Internet network that supports a website 138, and the network 136 may be a Bluetooth network. In other embodiments, the jumper 100 may be able to communicate over only a solitary network (e.g., via Bluetooth).

As shown in FIG. 5, the jumper 100 via the networking device 130 may communicate over the networks 134 and 136 with a mobile device 140. The mobile device 140 may be for example a cellular phone (e.g., the Apple® iPhone, the Samsung® Galaxy, the LG® G3, et cetera), a laptop computer, a tablet, a PDA, or any other mobile computing device whether now known or subsequently developed. The mobile device 140, as is known, may include a mobile device processor 140P, a storage unit 140S (e.g., a hard drive, SD Card, et cetera), a memory 140M, an input device 140P (e.g., a keyboard, touch screen, et cetera), an output device 140O (e.g., a display screen, speakers, a vibrating motor, et cetera), and a networking device 140N. The networking device 140N may allow the mobile device 140 to communicate wirelessly over networks, such as the networks 134 and 136, with the jumper 100. Only one mobile device 140 is shown in FIG. 5. The skilled artisan will readily appreciate, however, that the jumper 100 may in the same manner communicate with multiple mobile devices 140; for example, as shown in FIG. 6, the jumper 100 may wirelessly communicate with mobile devices 140A, 140B, and 140C.

Figure 6:
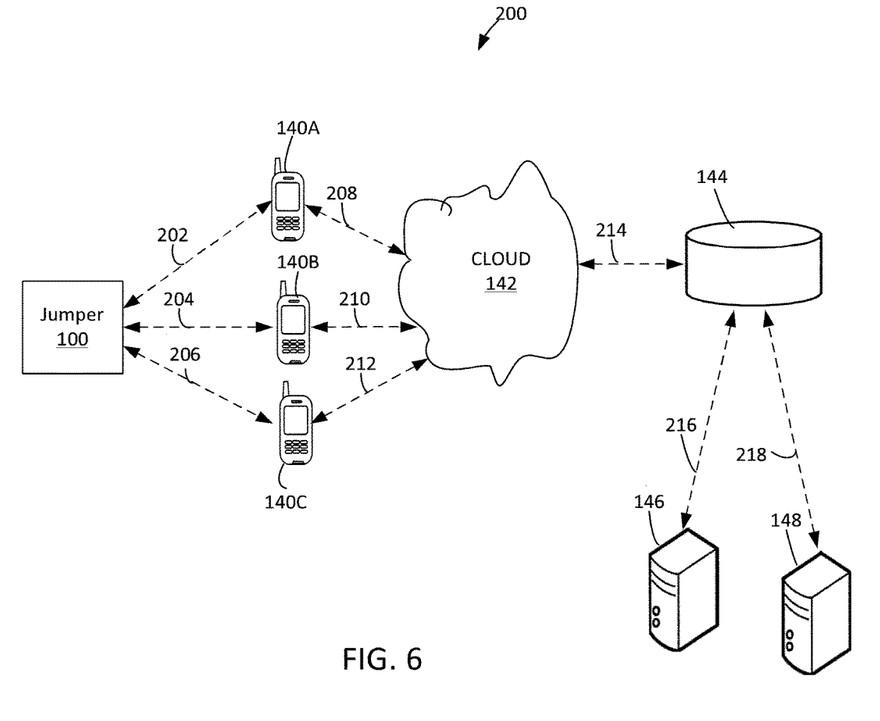
FIG. 6 is a schematic illustration of a method for transmitting data to and from the jumper of FIG. 3 to mobile devices and servers, according to an embodiment.

FIG. 6 shows a method 200 for transferring data to and from the jumper 100, according to an embodiment. The jumper 100, at steps 202, 204, and 206, respectively, may communicate with (i.e., transmit data as discussed in more detail below) the mobile devices 140A, 140B, and 140C. For example, the jumper 100 may wirelessly communicate with the mobile devices 140A, 140B, and 140C over a Bluetooth network. The skilled artisan will appreciate that the steps 202, 204, and 206 may occur generally simultaneously, or that some time (e.g., seconds, minutes, hours, days, et cetera) may elapse between the performance of the steps 202, 204, and 206, and also between the remaining steps of the method 200.

At steps 208, 210, and 212, the mobile devices 140A, 140B, and 140C may respectively transmit information to "the cloud" (e.g., cloud 142). The cloud 142 may be a public cloud, a private cloud, a hybrid cloud, a backup cloud, or any other type of cloud now known or later developed. The skilled artisan understands that cloud computing (i.e., the cloud) involves deployment of groups of remote servers and software networks that allow centralized data storage and wireless online access and that the cloud architecture allows for more efficient sharing of resources between the users of the cloud.

At step 214, a central database 144, which may be in electronic communication with the cloud 142, may receive the information transmitted by the jumper 100. The central database 144 may be in data communication with a plurality of local servers, such as servers 146 and 148. The servers 146 and 148 may at steps 216 and 218, respectively, receive the information transmitted by jumper 100, and store this data and provide access thereto. It will be appreciated that each of the servers 146, 148 may, but need not, download or store all the information transmitted by every jumper 100. For instance, the server 146 may be configured to retain information only about a particular jumper 100 or set of jumpers 100 (e.g., the jumpers 100 being used in a first geographical area), and the server 148 may be configured to store information about a different jumper 100 or set of jumpers 100 (e.g., the jumpers 100 being utilized in a second geographical area). The skilled artisan will thus appreciate that while a solitary jumper 100 is shown in FIG. 6, the method 200 may involve a plurality (e.g., dozens, hundreds, thousands, et cetera) of jumpers 100 transmitting data to a plurality of mobile devices (e.g., the mobile devices 140A, 140B, and 140C). In some embodiments, the servers 146, 148 may be communicatively coupled to and support the website 138 (see FIG. 5). Data transmitted from the jumper 100 may be accessible over the website 138. The website 138 may be a public website or a private website (e.g., have password protection, data encryption, et cetera).

The method 200, as outlined above, progresses sequentially from step 202 to step 218. It will be appreciated however, that the method 200 may also be effectuated in the reverse. For instance, data (such as a command, as discussed in more detail below) may be sent using the server 148 (e.g., by software associated with the server 148 or manually by personnel) to the database 144, which may in turn transmit the command to a mobile phone (e.g., the mobile phone 140B) via the cloud 142, which mobile phone may in-turn transmit the command to the jumper 100. Of course, commands or other data transmitted to the jumper 100 need not originate at the servers (e.g., the servers 146, 148); for example, data may be entered directly into the mobile phone 140A for transmission to the jumper 100.

Figure 7:
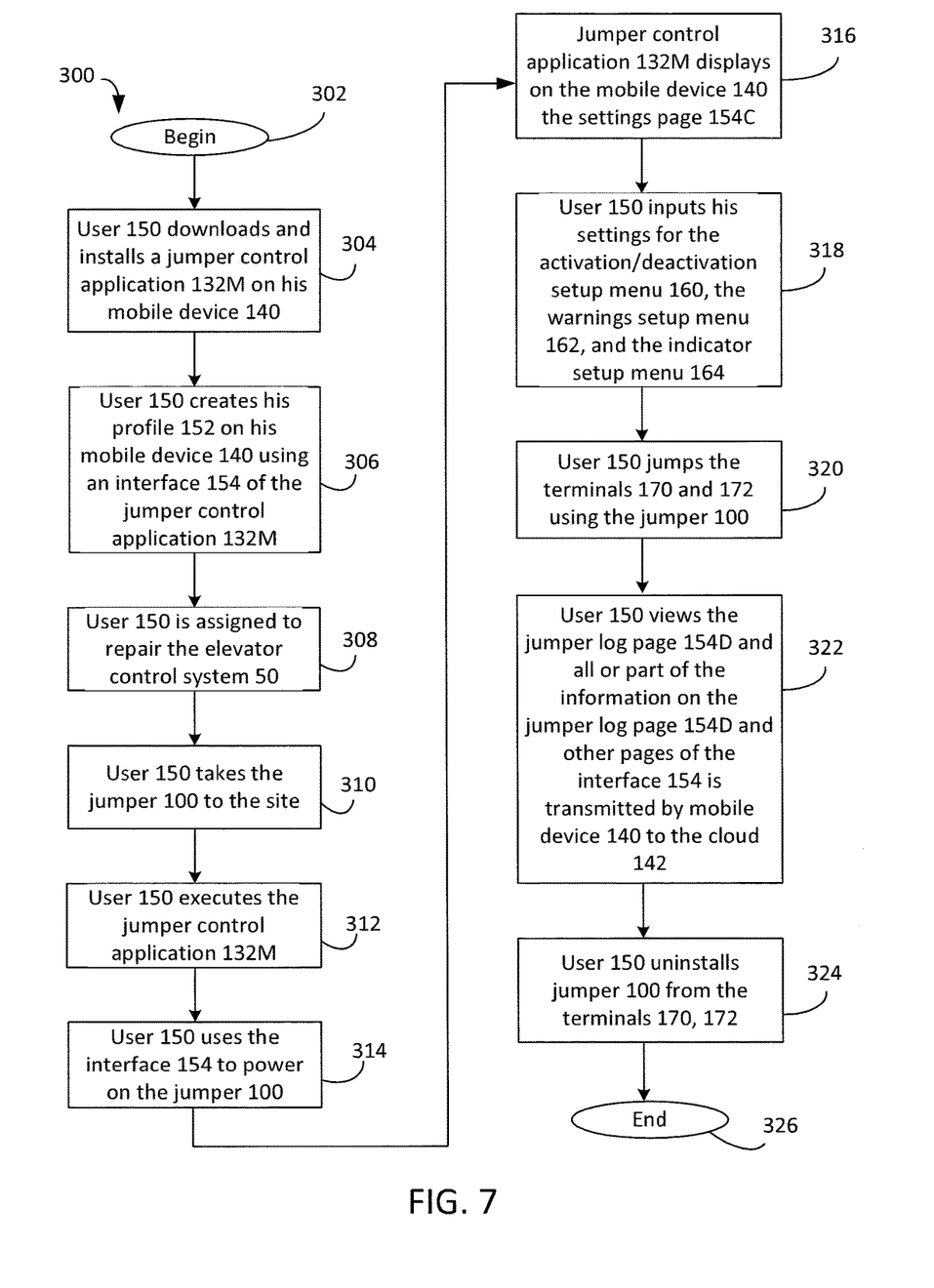
FIG. 7 is a flowchart illustrating a method of using the jumper of FIG. 3.

Attention is directed now to FIG. 7, which shows a method 300 illustrating the use of the jumper 100 by a user 150 (e.g., a service technician or another). The skilled artisan will appreciate that the method 300 is exemplary only and is not intended to be limiting.

The method 300 begins at step 302. At step 304, the user 150 may download and install a mobile application (herein a "jumper control application") 132M on his mobile device 140. The skilled artisan understands that the term "mobile application" refers to a computing/software application designed to operate on a mobile computing device. The jumper control application 132M may be downloaded to the mobile device 100 wirelessly or via a wired connection using any suitable means. As discussed in more detail below, the jumper control application 132M may work in conjunction with the program 132J (see FIG. 5) to allow the mobile device 140 to interact with the jumper 100. A dashed outline in FIG. 5 within the memory 140M represents the jumper control application 132M loaded into the memory 140M and a dashed line between the storage unit 140S and the memory 140M illustrates the transfer of the application 132M between the storage unit 140S and the memory 140M. While not required, it is contemplated that in some embodiments the user 150 may be charged a fee for downloading and installing the jumper control application 132M on the mobile device 140.

At step 306, the user 150 may create a unique profile 152 on his mobile device 140 using an electronic interface 154 of the jumper control application 132M. The interface 154 may contain several pages (e.g., a home page, a profile page, a settings page, a status page, et cetera) and may allow the user 150 to interact with (e.g., obtain data from or transmit data to) the jumper 100 via the jumper control application 132M. Data in the profile 152 may be stored in the storage unit 122 of the jumper 100, in the storage unit 140S of the mobile device 140, or both. In some embodiments, some or all of the data in the profile 152 may be stored in the storage unit 140S of the mobile device 140 and be accessible by the program 132J wirelessly. Similarly, in embodiments, data in the profile 152 may be stored on the cloud 142 (or on the database 144 or servers 146, 148) and may be accessed by the mobile device 140 and the jumper 100 (via the processor 120 and the program 132J) as required.

Figure 8A:
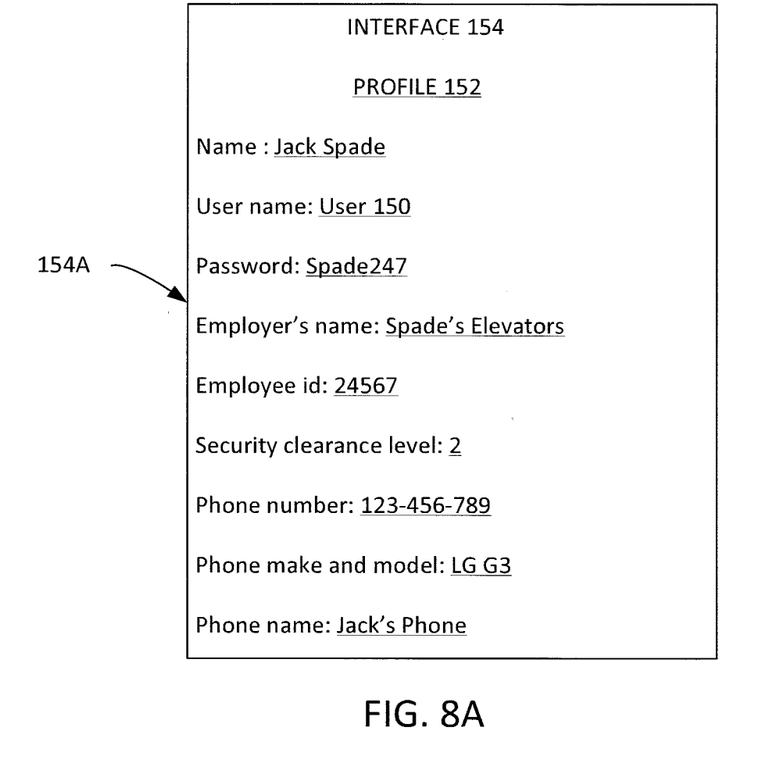
FIGS. 8A, 8B, 8C, and 8D are schematic illustrations of pages of an interface of a jumper control application for monitoring and controlling the operation of the jumper of FIG. 3, according to an embodiment.

FIG. 8A shows a profile page 154A illustrating the creation of the profile 152 by the user 150. The user 150 may enter using the profile page 154A (e.g., via the input device 140P of the mobile device 140) information identifying the user 150, the mobile device 140, and other pertinent information. For example, as shown in the figure, the user 150 may enter his name, username, password, employer's name, employee identification number, security clearance level, phone number, phone make and model, et cetera, using the profile page 154A. The skilled artisan will appreciate that the profile 152 is merely exemplary, and that a profile of a user may include additional fields, and need not include all (or any) of the fields specifically shown in FIG. 8A.

Returning now to the method 300 at FIG. 7, at step 308, the user 150, who as noted may for example be a service technician, may be assigned to repair (or perform maintenance work on) a control or other system, such as the elevator control system 50. The user 150 at step 310 may take the jumper 100 with him to the site where the elevator control system 50 is located. At step 312, the user 150 may execute the jumper control application 132M on his mobile device 140. The jumper control application 132M may allow the user 150 to power up the jumper 100 remotely via the mobile device 140. For example, the jumper control application 132M may display on the output device 140O of the mobile device 140 (e.g., a display) a home page 154B of the interface 154 (see FIG. 8B), which the user 150 may utilize to issue a command 153 to cause the jumper 100 to power up at step 314.

Figure 8B:
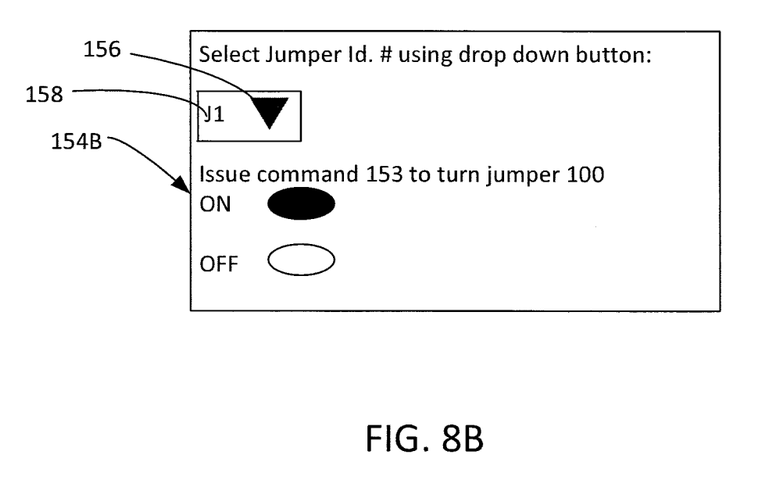

The home page 154B may, as shown in FIG. 8B, include a drop down menu button 156. The drop down menu button 156 may allow the user 150 to choose which jumper 100 he wants powered on. Each jumper 100 may be identified using a unique identification number 158, which may for example be hardcoded in the jumper 100 using methods now known in the art or subsequently developed. The unique identification number 158 may comprise a unique 128 bit code or another unique identifier. In this example, assume that the unique identification number 158 of the jumper 100 powered on by the user is J1. The skilled artisan will appreciate that the user 150 may similarly have powered on other jumpers 100 using the drop down menu button 156. The software instructions of the jumper control mobile application 132M may use any suitable criteria to determine which jumpers 100 may be displayed when the user 150 uses the drop down menu button 156; for example, the jumpers 100 displayed via the drop down menu may include jumpers 100 associated with the employer employing the user 150, jumpers 100 in a particular geographical region, jumpers 100 within the range of a network, et cetera.

Figure 8C:
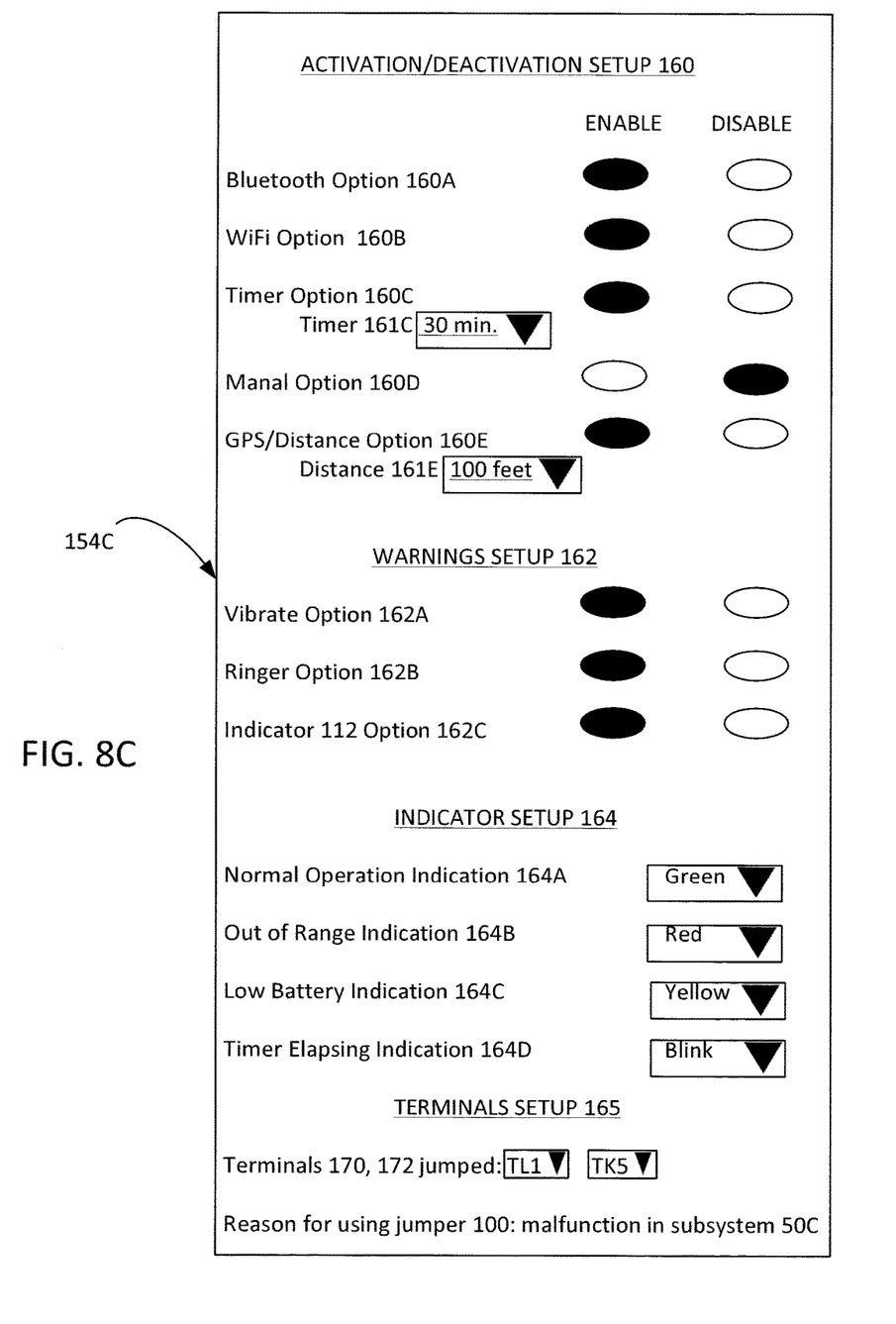

At step 316, the jumper control application 132M may display on the output device 140O a settings page 154C of the interface 154 to allow the user 150 to set certain requirements and preferences regarding the operation of the jumper 100. For example, as shown in FIG. 8C, the settings page 154C of the interface 154 may comprise an activation/deactivation setup menu 160, a warnings setup menu 162, and an indicator setup menu 164.

The activation/deactivation setup menu 160 may comprise, only by way of example, a Bluetooth option 160A, a WiFi option 160B, a timer option 160C, a manual option 160D, and a GPS/distance option 160E, each of which the user 150 may be allowed to utilize to activate and/or deactivate the jumper 100 as discussed below. When the jumper 100 is activated, the jumper 100 may allow the communication medium (e.g., electricity) to pass through from the first connector 102 to the second connector 104 (i.e., function akin to the prior art jumper 10), whereas when the jumper 100 is deactivated, the jumper 100 using the program 132J may disallow the communication medium (e.g., electricity) from passing through the connectors 102 and 104. In some embodiments, powering the jumper 100 on may automatically activate the jumper 100, whereas in others, the jumper 100 may need to be separately activated after it is powered on.

Where the user 150 enables the Bluetooth option 160A, the jumper control application 132M, in conjunction with the program 132J, may allow the user 150 to activate or deactivate the jumper 100 using his mobile device 140 over the Bluetooth network 136 (see FIG. 5). This feature may thus allow the user 150 to activate or deactivate the jumper 100 using the input device 140P (e.g., a keyboard, touchscreen, et cetera) of the mobile device 140 while the user 150 is several feet (e.g., 50 feet, 100 feet, 150 feet, et cetera) away from the jumper 100. In some embodiments, when the Bluetooth option 160A is enabled, an individual via the server (e.g., the server 146) or the database 144 may also be able to send a command to the mobile phone 140 (e.g., over the WiFi network 134 using the networking device 140N), and the mobile phone 140 may in-turn cause the jumper 100 to activate or deactivate by communicating with the jumper 100 over the Bluetooth network 136.

The WiFi option 160B, where enabled, may allow the user 150 to utilize his mobile device 140 to activate or deactivate the jumper 100 over the network 136. The network may be a WiFi network or another suitable network (e.g., CDMA, GSM, RFID, et cetera). In some embodiments, an administrator (or other individual) may be able to utilize the website 138 to issue a command to the mobile device 140 to activate or deactivate the jumper 100. It is also contemplated that in some embodiments an administrator (or another) may remotely activate or deactivate (or power the jumper 100 on or off) directly over the network 134 (e.g., via the website 138). The skilled artisan will understand, however, that this functionality (and the other such features of the invention detailed herein) are not required or intended to be independently limiting.

The timer option 160C, where enabled, may allow the user 150 to set a time on a timer 161C after which the jumper 100 will automatically deactivate. For example, the user 150 may be able to set the timer 161C to thirty minutes (or another duration); and once thirty minutes elapse from the jumper 100 being activated (or powered on), the jumper 100 may automatically deactivate (i.e., disallow the communication medium (e.g., electricity) from passing through the connectors 102, 104). More specifically, software instructions of the jumper control application 132M installed on the mobile device 140 may cause the mobile device 140 to communicate over the network 134 and/or 136 with the program 132J of the jumper 100, and in conjunction therewith, may cause the jumper 100 to deactivate when the time of the timer 161C elapses.

The manual option 160D, when enabled, may allow the user 150 to manually activate or deactivate the jumper 100. For example, the jumper 100 may have a switch or button which the user 150 may utilize to activate or deactivate the jumper 100. Where the manual option 160D is disabled, the user 150 may be able to activate or deactivate the jumper 100 only via the mobile device 140; such functionality may ensure that the jumper 100 is not activated or deactivated by unauthorized personnel (e.g., children in the area).

The GPS/Distance option 160E of the jumper control application 132M, where enabled, may in cooperation with the jumper program 132J cause the jumper 100 to deactivate when the user 150 (specifically, the mobile device 140) is at a specified distance 161E from the jumper 100. In some embodiments, the user 150 may be allowed to set this distance 161C (e.g., 20 feet, 50 feet, 100 feet, et cetera) via the interface 154 (using a drop down menu or other means), whereas in other embodiments, the distance 161E may be fixed (e.g., set by a developer of the application 132M). As discussed below, the user 150 may in embodiments be warned that he (specifically, his mobile device 140) is now at the distance 161E from the jumper 100, thereby prompting the user 150 to return to the site (or remotely change a setting, for example) in case the jumper 100 was left behind inadvertently.

The warnings setup menu 162 may allow the user to enable or disable one or more of a vibrate option 162A, a ringer option 162B, and an indicator option 162C. When the vibrate option 162A is enabled, the jumper control application 132M may cause the mobile device 140 to vibrate to indicate the presence of a condition (e.g., a warning condition, a normal operating condition, et cetera) and/or to instruct the user to check a jumper log page 154D of the interface 154 (discussed below); for example, the jumper control application 132M may cause the mobile device 140 to vibrate if the timer 161C is about to elapse, if the user 150 is at a certain distance (e.g., within five feet of the distance 161E) from the jumper 100, if the battery 129 is low, et cetera. In some embodiments, while the jumper 100 is activated, the jumper control application 132M may periodically (e.g., every ten minutes) cause the mobile device 140 to vibrate to remind the user 150 that the jumper 100 is activated. The ringer option 162B, similarly, where enabled, may cause the mobile device 140 to ring to indicate the presence of a condition and/or to remind the user 150 to check the jumper log page 154D discussed below. The indicator option 162C may allow the user 150 to indicate that he wants the indicator 112 of the jumper 100 (see FIG. 3) to convey information about the operation of the jumper 100.

While not required, the user 150 may in some embodiments be allowed to personalize the way in which the indicator 112 conveys information. For example, the user 150 may be able to provide (using the mobile device 140 via the settings page 154C) that the indicator 112 should: light up in green to indicate that the jumper 100 is operating normally (a normal operation indication 164A); light up in red to indicate that the user 150 is out of range (e.g., out of range of the Bluetooth network 136, herein an out of range indication 164B); light up in yellow to indicate that the rechargeable battery 129 has a low charge (a low battery indication 164C); and blink to indicate that the timer 161C set using the timer option 160C is about to elapse (a timer elapsing indication 164D). Such configurability may be particularly beneficial where the jumper 100 has a solitary indicator (e.g., a light) 112 that is intended to convey varying information to the user 150; however, as noted above, the indicator 112 may in some embodiments comprise multiple indicators (e.g., an LED light for the normal operation indication 164A, another LED light for the low battery indication 164C, an audible alarm for the timer elapsing indication 164D, et cetera).

In some embodiments, the low battery indication 164C may be dependent on the timer 161C. For example, if the timer 161C is set to thirty minutes but the battery 129 only has sufficient charge to power the jumper 100 for 20 minutes, the low battery indication 164C may be given. In other embodiments, the low battery indication 164C may be given when the charge remaining on the battery 164 is low (e.g., 10% charge remaining, 5% charge remaining, et cetera).

In some embodiments, the settings page 154C may comprise a terminals setup menu 165. Using this menu 165, the user 150 may indicate which terminals 170, 172 he is jumping using the jumper 100. For example, as shown in FIG. 8C, the user 150 may indicate via the input device 140P that he is jumping terminals TL1 and TK5 using the jumper 100. While not required, the user 150 may also be allowed to indicate why the terminals 170, 172 are being jumped (e.g., to isolate a malfunction in the subsystem 50C, to perform maintenance, et cetera).

Returning now to the method 300 at FIG. 7, at step 318, the user 150 may use the settings page 154C of the interface 154 to configure the workings of the jumper 100 and the jumper control application 132M using the activation/deactivation setup menu 160, the warnings setup menu 162, and the indicator setup menu 164, as discussed above, and identify using the terminals setup menu 165 the terminals 170, 172 being jumped. Assume, only for the purposes of illustration, that the user 150 sets up these menus 160, 162, 164, and 165 as shown in FIG. 8C.

At step 320, the user 150 may couple the first connector 102 to the first terminal 170 (i.e., terminal TL1) and the second connector 104 to the second terminal 172 (i.e., terminal TK5) of the elevator control system 50. As noted above, coupling of the jumper 100 (when the jumper 100 is activated) to the terminals 170, 172 may cause the safety features 56S of the elevator control system 50 to be disabled.

Figure 8D:
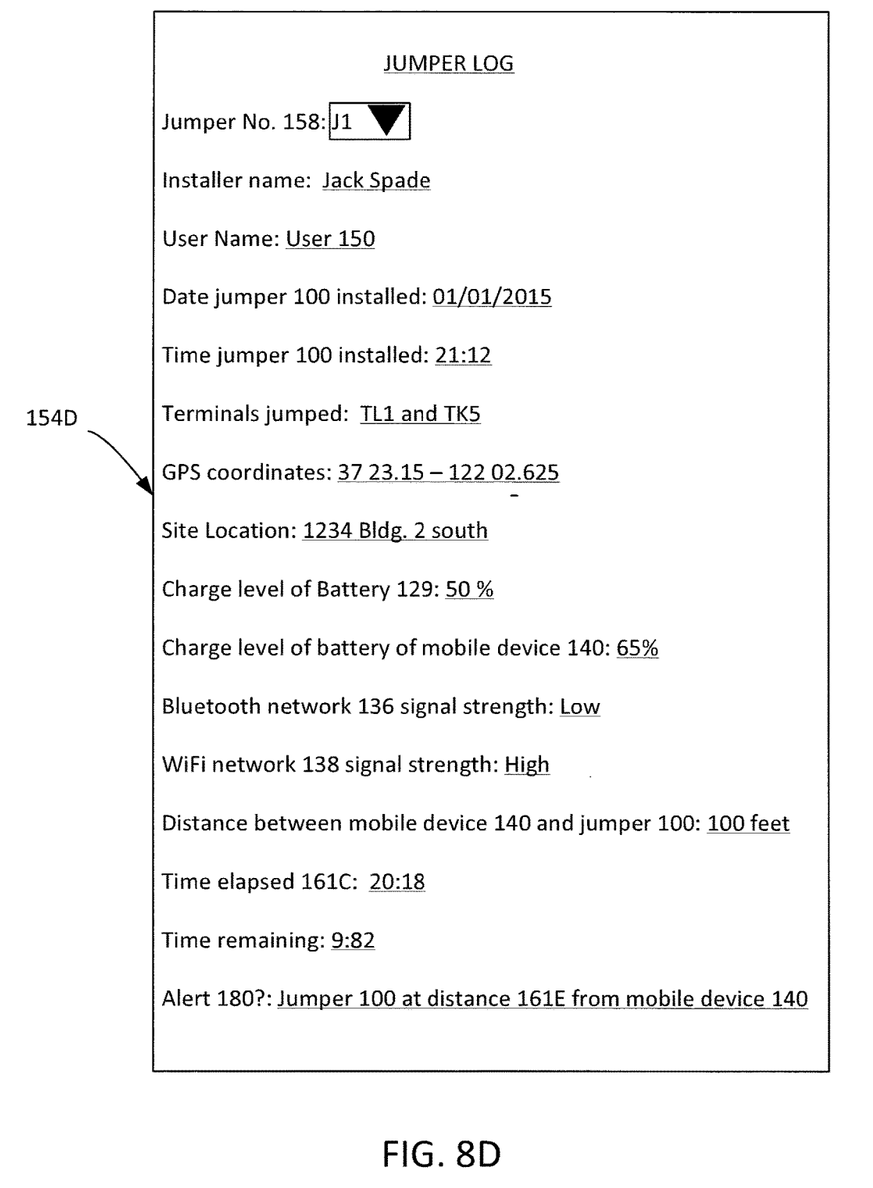

At step 322, the user 150 may access (e.g., when directed to do so by the jumper control application 132M via the out of range indication 164B or timer elapse indication 164D, or of his own volition) the jumper log page 154D of the interface 154, as shown in FIG. 8D. Akin to the other pages of the interface 154, the skilled artisan will understand that the jumper log page 154D is exemplary only and is not intended to be limiting.

The jumper log page 154D of the interface 154 may provide pertinent information about the operation of the jumper 100. For example, as shown in FIG. 8D, the jumper log page 154D may include the jumper identification number 158, the installer's name and user name, the date and time the jumper 100 was installed and on which terminals, the GPS coordinates and site location (e.g., physical address) of the jumper 100, the charge level of the battery 129, the signal strengths of the Bluetooth and WiFi networks 136, 138, distance between the mobile device 140 and the jumper 100, the duration for which the jumper 100 has been activated, the time remaining before the timer 161C elapses, alerts 180, et cetera. The alert 180 may, for example, apprise the user 150 that he is at the distance 161E from the jumper 100, the timer 161C is about to elapse, the strength of the networks 136 and/or 138 is undesirably low, the battery 129 has insufficient charge (e.g., less than 5%, less than 10%), et cetera. The jumper log page 154D may thus provide the user 150 up-to-date information about the jumper 100, and allow the user 150 to ensure that the jumper 100 is operating as required.

In some embodiments, all or part of the data on the jumper log page 154D (and on the other pages of the interface 154) may be transmitted by the mobile device 140 to the cloud 142 for storage (e.g., periodically, as soon as it is entered, based upon network strength and availability, et cetera). In these embodiments, an administrator may be able to query this data conveniently and obtain a complete record of the operation of the jumper 100 (e.g., Jumper J1 and other jumpers 100), including, for example, information about the individual who installed the jumper 100, whether any alerts 180 were issued, the number and location of the terminals 170, 172, and other such information.

At step 324, when the repair is complete, the user 150 may decouple the jumper 100 from the terminals 170, 172, and the method 300 may end at step 326. Of course, had the user 150 inadvertently left the jumper 100 coupled to the terminals 170, 172 as he exited the site, the alert 180 on the mobile device 140 may have reminded the user 150 of this fact and thereby prevented the undesirable consequences referenced above.

In some embodiments, the mobile device 140 may be a unique mobile device assigned to (or owned by) the user 150. Especially in these embodiments, once the user 150 powers the jumper 100 on (or enters his username and password), information the user 150 previously entered on the profile page 154 (e.g., when he first created his profile 152) and on the other pages of the interface 154 may automatically be fed to the jumper 100 and transmitted to the cloud 142 as required. Such functionality may obviate the need for the user 150 to manually enter into the mobile phone 140 a large amount of data each time he utilizes the jumper 100.

While the workings of the jumper 100 have been detailed above with reference to the elevator control system 50, the skilled artisan will appreciate that the elevator control system 50 is exemplary only and that the jumper 100 can also be advantageously utilized with other systems. The skilled artisan will further understand that reference to electricity as the communication medium is also only exemplary, and that the concepts disclosed above are equally applicable to jumpers utilizing other communication mediums (e.g., hydraulics, pneumatics, et cetera).

Thus, as has been described, the robust jumper control application 132M, in conjunction with the jumper program 132J, may allow the user 150 and others to monitor and control the workings of the jumper 100. Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:

1. A system comprising a jumper, a mobile device, and a server; the jumper being in bidirectional wireless communication with the mobile device; the jumper comprising a first processor in data communication with a first memory and the mobile device comprising a second processor in data communication with a second memory; the first memory including a first set of software instructions and the second memory including a second set of software instructions;
wherein:
the second set of software instructions, when executed by the second processor, performs steps for:
wirelessly transmitting from the mobile device to the jumper a command;
the command causing the jumper to one of activate and deactivate; and
outputting on the mobile device an alert when the mobile device is at a first distance from the jumper; the first distance being settable using the mobile device; the alert causing the mobile device to one of vibrate and ring; and the first set of software instructions, when executed by the first processor performs steps for:
transmitting, by the jumper, a log of the jumper to the server; the log identifying at least the alert, a location of the jumper, and a terminal to which a jumper connector is coupled.

2. The system of claim 1 wherein the steps of the second processor further comprise the step of periodically outputting on the mobile device a warning while the jumper is activated.

3. The system of claim 1 wherein the server is accessible via a website.

4. The system of claim 3 wherein the jumper includes a housing and an indicator light.

5. The system of claim 4 wherein the housing includes a rechargeable battery.

6. The system of claim 4 wherein the log comprises a jumper identification number for identifying the jumper.

7. The system of claim 6 wherein the steps of the first processor further comprise the step of deactivating the jumper after a first duration elapses; the first duration being settable using the mobile device.

8. The system of claim 7 wherein the steps of the first processor further comprise the step of outputting to the mobile device a low battery indication when a charge of the battery is insufficient to power the jumper for the first duration.

9. A jumper having a connector and a housing; the housing at least partially enclosing a processor in data communication with a non-transitory memory, a global positioning system, a rechargeable battery, and a networking device; the memory comprising software instructions that, when executed by the processor, perform steps for:
wirelessly transmitting data to a mobile device over a network; the data indicating a jumper identification number, a location of the jumper, and a duration after which the jumper will automatically deactivate; and
wirelessly outputting an alert to the mobile device when the mobile device is at a first distance from the jumper; the first distance being settable using the mobile device; the alert causing the mobile device to at least one of vibrate and ring.

10. The jumper of claim 9 wherein the housing further comprises an indicator light.

11. The jumper of claim 10 wherein an operation of the indicator light is configured to be personalized using the mobile device.

12. The jumper of claim 10 wherein the housing has a plurality of recessed portions for storage of a wire of the jumper.

13. The jumper of claim 12 wherein the network comprises a first network and a second network disparate from the first network.

14. The jumper of claim 13 wherein the first network is a Bluetooth network.

15. The jumper of claim 14 wherein when the networking device wirelessly receives a command from the mobile device, the software instructions further perform the step of deactivating the jumper.

16. The jumper of claim 14 wherein the data is accessible at a server; the server being remote from the jumper and the mobile device.

17. The jumper of claim 14 wherein the software instructions further perform the step of outputting to the mobile device a low battery indication when the charge of the battery is insufficient to power the jumper for the duration.

18. A system comprising a jumper, a mobile device, and a server; the jumper being in bidirectional wireless communication with the mobile device; the jumper comprising a first processor in data communication with a first memory and the mobile device comprising a second processor in data communication with a second memory; the first memory including a first set of software instructions and the second memory including a second set of software instructions;
wherein the second set of software instructions, when executed by the second processor, performs steps for:
wirelessly transmitting from the mobile device to the jumper a command; the command causing the jumper to one of activate and deactivate; and
outputting on the mobile device an alert when the mobile device is at a first distance from the jumper; the alert causing the mobile device to signal; and
wherein the first set of software instructions, when executed by the first processor, performs steps for transmitting a log of the jumper to the server, wherein the log comprises a jumper identification number.

19. The system of claim 18, wherein the signal is at least one of: a vibration, a ring, and an indicator.

20. The system of claim 18, wherein the mobile device is a cellular phone.

* * * * *